United States Patent [19]
Klose et al.

[11] 3,961,314
[45] June 1, 1976

[54] STRUCTURE AND METHOD FOR PRODUCING AN IMAGE

[75] Inventors: Peter H. Klose, Troy; Stanford R. Ovshinsky, Bloomfield Hills, both of Mich.

[73] Assignee: Energy Conversion Devices, Inc., Troy, Mich.

[22] Filed: Mar. 5, 1974

[21] Appl. No.: 448,289

[52] U.S. Cl. .................... 340/173 LS; 340/173 R; 340/173 LM; 250/213 R; 313/507
[51] Int. Cl.² ................ G11C 11/42; H01L 17/00
[58] Field of Search .... 340/173 R, 173 LT, 173 LS, 340/173 LM; 250/213 R; 313/108 A

[56] References Cited
UNITED STATES PATENTS

| | | | |
|---|---|---|---|
| 3,644,741 | 2/1972 | Ovshinsky | 340/173 A |
| 3,868,651 | 2/1975 | Ovshinsky | 340/173 LM |

OTHER PUBLICATIONS

IBM Tech. Dis. Bul., vol. 13, No. 10, (Mar. 1971), pp. 3001–3002, "Multilayer Memory ** for Beam Adpress", by Brodsky.
IBM Tech. Dis. Bul., vol. 15, No. 5, (Oct. 1972), pp. 1588–1589, "Reading Info Stored in Chalcogenie Films", by Welber.
IBM Tech. Dis. Bul., vol. 15, No. 5, (Oct. 1972), pp. 1606–1607, "Photoconductive Sandwich", by Fan.
IBM Tech. Dis. Bul., vol. 15, No. 11, (Apr. 1973), pp. 3305–3306, "Enhancing Temp. Rise of Beam Adpressed Memory", by Nethercot.

*Primary Examiner*—Terrell W. Fears
*Attorney, Agent, or Firm*—Wallenstein, Spangenberg, Hattis & Strampel

[57] ABSTRACT

A new structure comprising a layer of an imaging material, capable of undergoing an image forming change in response to energy, a layer of a barrier material and a layer of a catalyst material which, if necessary after activation, is capable of causing or promoting the image forming change in the imaging material. The barrier material is capable of controlling in accordance with a desired image pattern, the passage of the catalyst material through the barrier layer into contact with the imaging material in selected areas, while it prevents passage of the catalyst material in other selected areas.

The permeability of the barrier layer for the catalyst material and, if necessary the activation of the catalyst material, may be controlled by the selective imagewise application of imaging energy to the structure, and the image forming change in the imaging material may be brought about by the application of development energy, such as heat, to the structure to produce a detectable image in the layer of the imaging material.

79 Claims, 8 Drawing Figures

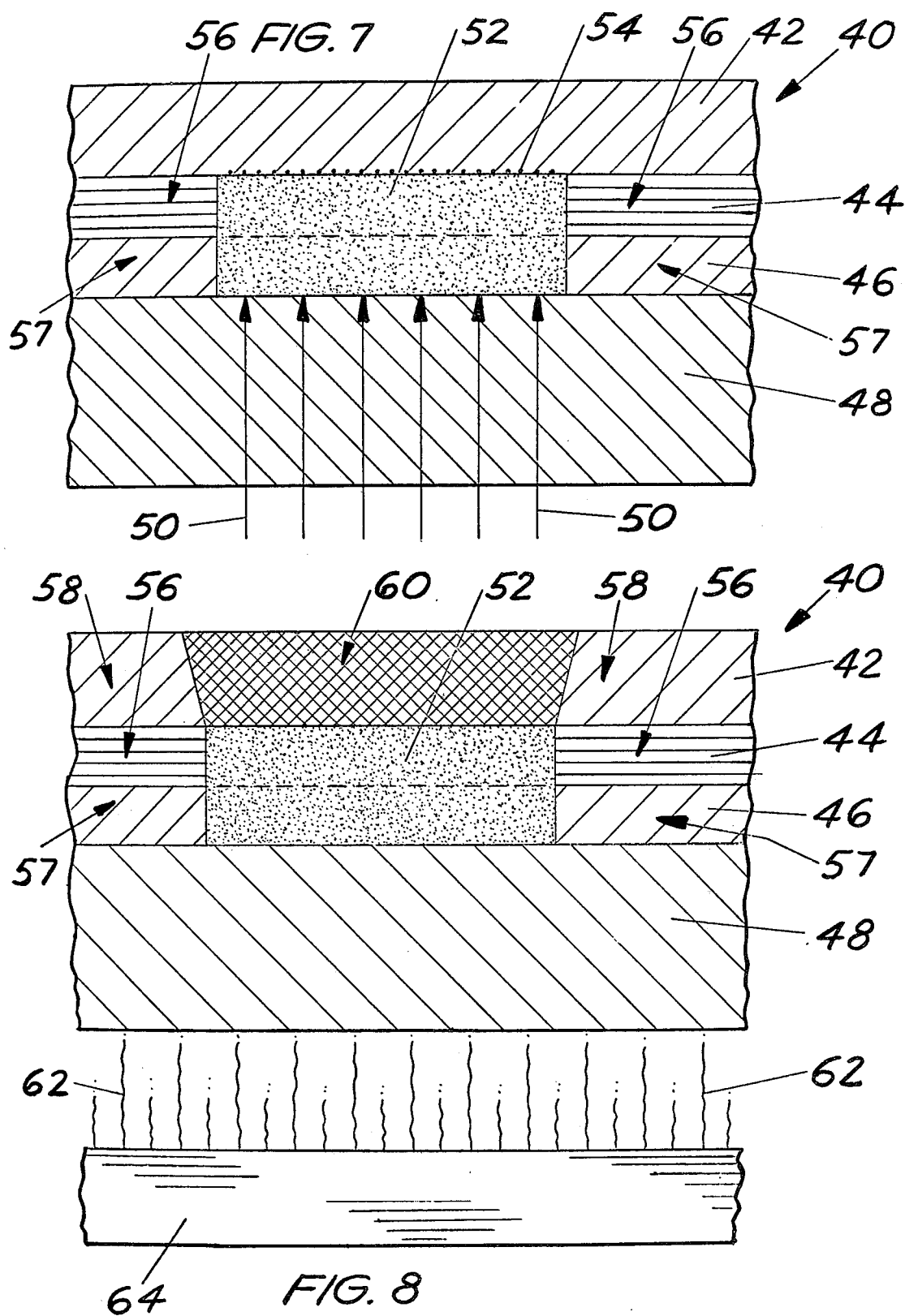

STRUCTURE AND METHOD FOR PRODUCING AN IMAGE

The present invention relates to a new imaging structure and to a new method for recording information and for imaging multilayer structures.

Copending U.S. patent applications Ser. No. 63,404, filed Aug. 13, 1970, by Stanford R. Ovshinsky and entitled "Method and Apparatus for Recording and Retrieving Information" (abandoned) and Ser. No. 161,219, filed July 9, 1971, by Stanford R. Ovshinsky and entitled "Method and Apparatus for Recording and Retrieving Information" (now U.S. Pat. No. 3,868,651, granted Feb. 25, 1975) describe a new method for bringing about a physical change in structure in selected areas of a memory material by the selective application of energy. In accordance with this method a catalytic material is employed to facilitate the physical change in structure under the effects of the energy. In one embodiment of this method, a catalytic material is employed in the form of a layer contacting the layer of memory material. The catalytic material is selectively activated by the energy so as to promote the physical change in structure in the memory material in those areas which are subjected to the energy.

The new structure of the invention comprises as the basic constituent a layer of an imaging material, which is capable of undergoing an image forming change in response to energy. The invention relates to such imaging materials wherein the image forming change can be catalyzed or promoted by the presence of a suitable catalyst. An "image forming change" is understood to be a change of detectable characteristics of the imaging material so as to form an image or a record of information which may be read visually or by any other desired method of information retrieval.

In contact with the layer of imaging material is provided a barrier layer comprising a barrier material and in contact with the barrier layer is provided a layer comprising a catalyst material, which is capable of promoting the image forming change in the imaging material when it is in contact therewith. The layer of barrier material has the capacity of controlling the transmission of the catalyst material from the layer of catalyst material to the layer of imaging material in response to energy.

In most preferred embodiment of the invention the basic layer of the imaging material comprises a memory material, which is capable of undergoing a physical change in structure in response to energy. A catalyst is comprised in the layer of catalyst material, which, if necessary after activation, and after passage through the barrier, is capable of promoting the physical change in structure in the memory material.

The new structure for imaging and for recording information, provided by the present invention permits a great increase in the contrast and distinction between the areas containing the recorded information, even if in addition to the energy, which is employed imagewise to selected areas, energy is provided to the structure as a whole for bringing about the image forming change in the imaging material such as the required physical change in structure in the desired areas of the memory material in a development step. Thus, the structure and method of the invention provide a selective increase of the sensitivity and contrast of the imaging material. This may be the result of heterogeneous nucleation being effected in the memory material by the catalyst. In other imaging materials the catalysis or promotion of the image forming change may be the result of similar effects or of any other desired effect of the catalyst in the image forming mechanism.

The term "catalyst material", as used herein, refers to a material which has a catalyzing or promoting effect upon the image forming change in the imaging material such as the physical change in structure of the memory material brought about by the application of energy. The catalyst may, for instance initiate or promote in the memory material nucleation of any desired kind and may increase the number of nucleation sites, with the resultant promotion of the physical change in structure of the memory material, when the appropriate energy is applied thereto. The catalyst seeds the memory material, thereby reducing the energy necessary for bringing about the physical change in the memory material or making the memory material responsive to energy, which would not otherwise bring about the physical change. The catalyst material used in the structure and method of the present invention may be present in activated form or it may be a material, which becomes activated or changed by the application of energy thereto to acquire such catalyzing or promoting effect upon the image forming change, such as upon the physical change in structure of the memory material. The term catalyst material means both or activated and inactive catalyst or a catalyst precursor.

More specifically, the catalysts used in the invention may be materials, which are capable of generating a nucleation site for the physical change of structure in the memory materials, when they are in contact therewith, for instance by selectively diffusing into the memory material. With other imaging materials, the catalyst may exert its promoting effect by any other desired mechanism, as may be appropriate for the particular imaging reaction taking place in these imaging materials. The catalyst material may be inactive or active, when it traverses the transmissive portion of the barrier layer. Important is only, that it is or becomes activated, when it contacts the layer of memory material. The catalyst may also cause or initiate the image forming change, where it contacts, after passing through the barrier layer, the imaging material, without the need for the application of development energy.

The term catalyst, as used herein, means also a material which exerts a negative catalyzing effect by reducing the sensitivity or reactivity in those areas of the imaging material or memory material, which it contacts or into which it diffuses. In this manner, a differential sensitivity or reactivity is produced in different areas of the imaging material. The use of the "negative catalyst" therefore constitutes another way of producing contrast in the imaging material, if the energy used for developing the image is applied to the structure as a whole. This manner of image formation becomes of particular value in combination with the barrier principle of the present invention. The foregoing shows that a catalyst may not only narrow the energy gap but it may also increase the energy gap.

By the use of the barrier layer of the invention it is possible to form a latent image by generating nucleation sites in an imaging step. This latent image may be developed at a later time in a separate development step.

By increasing the number of sites, at which the image forming change such as the physical change in structure of the memory material, for example, crystallization, is initiated under the effect of energy, the desired degree of physical change of structure is completed in less time. This makes it possible to shorten the time of energy application in the imaging step as well as in the developing step. In some cases the catalyst may change the mobility of the change carriers to result in either an increase or decrease of the actual growth rate in the physical change of structure.

Selenium and various other selenium containing compositions are typical examples of the imaging materials, which may be used in the present invention. In these materials the growth rate of the hexagonal selenium crystals is about 1/20 of a micron per second at a given elevated crystallization temperature and without illumination. By adding illumination of a sufficient energy level, the growth rate may be increased by a factor of about 20 to about 1 micron per second. If in this example, the average spacing of the nucleation sites is, for example, 100 microns, it takes at this illuminated rate of 1 micron per second about 50 seconds until neighboring crystals have grown to a size that they meet. By employing a catalyst, the number of nucleation sites will be greatly increased and accordingly the average spacing between nucleation sites will be correspondingly reduced. If in the catalyzed crystallization in the above example, the average spacing of nuclei is, for instance, 10 microns, the time required for the crystals to grow together will be only about 5 seconds. As will be apparent, this tenfold decrease in the crystallization time for achieving full coverage in the plane of the memory material, was effected by the catalyst without changing the growth rate of the individual crystals. On the other hand, by adding sulfur in optimum ratios of about 1 to 15 atomic percent to the selenium or by adding other growth promoting materials, the growth rate of the individual grains may be increased by a factor of up to two or sometimes even more. Thus as will be apparent, for highest speed of image formation in the memory material, it is desirable to combine these various factors and particularly increase the number of nucleation sites by the utilization of the catalyst which assists in the initiation of the nuclei, thus increasing the number of nuclei at the sites at which the physical changes of the memory material are to take place.

Another effect of the catalyst is that it controls the size of the nuclei, bringing their size above a certain critical limit at which the image forming changes or physical changes can be initiated to take place at these nuclei and continue, if desired, in chain reaction fashion throughout the exposed areas of the memory material, in which the latter is contacted by the catalyst. In this manner, a high differential between the imaging and background areas is readily achieved.

In the foregoing example of the crystallization of selenium, the growth of crystals initiated by thermal nucleation may be suppressed or prevented by the use of a crystallization inhibitor, such as arsenic. As is apparent from the foregoing, the contact of the crystallization inhibitor with the memory material may be selectively controlled by the barrier of this invention.

The barrier layer has the capacity of controlling the access of the activated catalyst material to the layer of the imaging material such as a memory material, thereby controlling imagewise the density of the nuclei or crystallization centers and thus the speed of the image forming changes such as the physical change in structure of the memory material under the effects of energy.

The barrier layer acquires its capacity of controlling the access of the activated catalyst material to the layer of imaging material by the effect of energy applied imagewise to selected areas of the structure including the imaging layer, the catalyst layer and/or the barrier layer. This may be achieved by the fact, that a barrier layer which is normally transmissive for the catalyst, may become, under the effect of energy, such as radiant heat energy, electromagnetic radiation and/or particle energy, a closed structure for the catalyst, so that the passage of the catalyst through the areas of the barrier layer which have been exposed to the imagewise energy, is prevented or retarded, while the non-exposed areas of the barrier layer permit freely the passage of the catalyst. Vice versa, a barrier layer, which is nontransmissive or has a low transmissiveness for the catalyst, may become transmissive or more transmissive in selected areas as the result of the selective application of energy to these areas.

The controlling effect of the barrier layer may be mechanical, where an originally porous or spongy barrier layer may become continuous and impermeable for the catalyst in those areas where it is subjected to the effect of the imaging energy. In another embodiment, a barrier layer, which is originally impermeable to the catalyst, may become transmissive for the catalyst in those areas, where it is subjected to the imaging energy, for instance, by cracking or breaking up or by foaming up to form a spongy transmissive structure in the image areas. The controlling effect may also be chemical or a combination of a chemical and mechanical effect. For instance, the barrier layer may change its chemical composition in those areas, where it is subjected to energy. If it permits, for instance, diffusion or migration of the catalyst in its original condition, the barrier material may change its chemical composition under the effects of the imaging energy in the areas exposed to the energy, so that the catalyst cannot diffuse or migrate through those areas of the barrier layer, which have chemically changed in this manner, or vice-versa, a barrier layer which is impermeable for the catalyst in its original condition, may change, under the effect of the imaging energy its chemical composition, so that the catalyst may diffuse or migrate through the barrier layer in those areas, which have been subjected to the imaging energy.

The changes in the transmissiveness of the barrier layer for the catalyst may also be brought about as a secondary effect. When the imaging structure is subjected to the imaging energy, an interaction of the imaging material or memory material with the barrier material in the barrier layer may result to produce differential transmissiveness for the catalyst in the barrier layer. The barrier material may mechanically or physically react with the imaging material or memory material under the effect of the imaging energy to produce at the interface, for example, a membrane-like layer, which is not transmissive for the catalyst. In this manner, the catalyst can diffuse or migrate under the effect of the energy only through those areas which have not been subjected to imaging energy to produce nucleation sites or other sites for the initiation of the image forming change in the unexposed areas. Using a barrier material, which is non-transmissive for the catalyst, it is also possible that the barrier layer becomes transmissive for the catalyst in the areas, where it is subjected to the imaging energy, by reacting with the imaging material or memory material, for instance, in a chemical reaction which forms a new reaction product which is transmissive for the catalyst.

In still another embodiment of the invention, a material may be deposited in contact with the barrier layer, which upon subjecting it imagewise to energy, reacts with the barrier material to form an activatable or activated catalyst, which in turn is capable of diffusing or migrating through the barrier in the exposed areas and in contact with the imaging material or memory material to form the desired nucleation sites or the sites for other image forming changes. The catalyst layer may, for instance, comprise a catalyst precursor, which upon reaction with the barrier material under the effect of the imaging energy, forms a reaction product with the barrier material, which in turn is transmissive for the activated catalyst formed from the catalyst precursor. Or, the catalyst material and the barrier material may react, under the effect of the energy to produce a reaction product or activated catalyst moieties, for which the barrier material is transmissive. In all these cases, the barrier material in the unexposed areas effectively acts as a barrier, preventing or retarding the migration of any material which is or may become catalytically active.

As is apparent from the foregoing, in the new structures of the invention the catalyst material may be present in the catalyst layer in active form or, it may be present in inactive form, and become activated by the imagewise applied energy at the same time that the foregoing described change occurs in the barrier layer under the effects of the energy. Or, the catalyst material may become activated, when it contacts the layer of imaging material.

The imagewise applied energy may cause, aided by the presence of the catalyst diffusing or migrating through the layer of the barrier material, the image forming change to take place in the image areas of the imaging material. Or, if desired a separate treatment involving the application of development energy to the layer of memory material, such as heating of the structure above the transition temperature in the case of a memory material, or the application of any other suitable development energy, as may be appropriate for a given imaging material, may bring about the actual physical change in structure in the memory material or other image forming change in those areas of the imaging material, where the catalyst is permitted to contact the layer of memory material or other imaging material.

If the catalyst material is present in the catalyst layer in an inactive form, it may become activated as a result of energy applied imagewise to selected areas of the catalyst layer and of the barrier layer. This energy induced activation of the catalyst precurosr may be the result of interaction with the barrier layer in those areas where the energy is applied. In this case neither the imaging energy by itself will be sufficient to activate the catalyst, nor will the barrier material by itself be capable of reacting with the catalyst precursor to activate the catalyst, and essentially no interaction will take place between the barrier material and the catalyst material in the absence of the imaging energy. This embodiment of the invention is particularly effective when the imaging energy is light. The catalyst, being activated in the areas subjected to the imaging energy, is capable and permitted to diffuse or migrate through the barrier layer, while the inactive catalyst is incapable of diffusing through those areas of the barrier layer, which have not been subjected to the imaging energy. Thus in effect, in the areas of the barrier material, which have not been subjected to energy, a barrier is set up for the catalyst, while the catalyst is permitted to freely migrate to and contact the layer of memory material or other imaging material in all those areas, where the catalyst has been activated as a result of having been subjected to the imaging energy. By proper choice of conditions and material, also the opposite is possible. This shows that also in this embodiment of the invention the barrier layer becomes operative as a non-transmissive barrier in those areas of the layer which have not been subjected to energy, while those areas of the barrier layer, which have been subjected to the imaging energy, such as light, become transmissive for the catalyst. Thereby, energy induced migration, such as migration induced or accelerated by stress, by a chemical gradient, by an electrical field and the like, may take place.

It follows from the foregoing that the barrier may exist in two states, viz. in a transmissive and a non-transmissive state or in a state of low transmissiveness and in a state of high transmissiveness. Important is only, that there is a substantial differential in the degree of transmissiveness of the barrier layer in these different states for the catalyst. For the purposes of the invention, the state of high transmissiveness is included in the term "transmissive" and the state of low transmissiveness is included in the term "non-transmissive".

The transmissiveness of the barrier layer may also be altered and controlled in another manner by the use of one kind of energy for imaging, which in turn triggers in the selected image areas a second kind of energy, which actually changes the transmissiveness of the barrier layer for the catalyst. For example, light may be used as the imaging energy, which in turn controls an electrical field or triggers the flow of electrical current. Thereby, the electrical energy acts as the secondary force, which breaks the barrier or which renders the barrier layer in the selected areas transmissive or non-transmissive for the catalyst as the case may be. This mode of operation reduces the intensity requirements for the initial imaging energy, such as light and speeds up the response. At the same time, the secondary energy, such as electricity, may serve as the driving force, which causes or accelerates migration of the catalyst through the transmissive areas of the barrier layer. The diffusion of the catalyst through the barrier layer may also be brought about by a diffusion gradient. The diffusion or migration of the catalyst through the transmissive areas of the catalyst may be accelerated by providing, for instance, a critical thermal gradient or by setting up an appropriate electrical field in the case of, for instance ionic catalysts or carriers.

A preferred structure of the invention, wherein the catalyst becomes activated by reaction with the barrier material may, for instance, comprise a layer of a memory material, which is capable of undergoing a physical change in structure in response to the effects of energy, a layer of a barrier material in contact with the layer of memory material, and a layer of an inactive catalyst material in contact with the layer of the barrier material, wherein the inactive catalyst material is a material, which when activated and in contact with the layer of memory material, catalyzes the physical change in structure of the memory material, and wherein the barrier material is a material which is capable of interaction with the inactive catalyst material, when subjected to imaging energy, to produce an activated catalyst material. By the reaction with the catalyst material the barrier material becomes transmissive for the activated catalyst. The invention includes also structures of this type wherein any other suitable imaging material is substituted for the memory material.

The structures of the invention described hereinbefore may also comprise a substrate, which is preferably provided in contact with the layer of catalyst material. The substrate may also be in contact with the memory material other imaging material, or a substrate may be provided both at the layer of memory material or other imaging material and at the layer containing the catalyst material.

The present invention is also concerned with a method of producing an imaged structure. Principally, in this method a structure of the above described kind is provided which comprises a layer of an imaging material, a barrier layer and a layer comprising a catalyst material or a catalyst precursor material. Imaging energy is applied in a pattern to selected areas of the structure including the barrier layer, the catalyst layer and/or the imaging layer. Thereby the barrier material operates in the selected areas to produce a differential in the transmissiveness of the catalyst in different areas of the barrier layer. As a result, the catalyst material is permitted to contact the imaging material in selected areas, so as to promote an image forming change, in these selected areas. Usually, the desired selective image forming change is brought about by the application of sufficient energy to form an image of recorded information.

It is apparent from the foregoing that in the just recited method, the application of energy in a pattern to selected areas of the structure including the barrier layer and a layer of a catalyst precursor material will activate the catalyst, permitting the activated catalyst to contact the imaging material in the selected areas in accordance with the pattern of energy. It is also apparent, that with the use of the expedient of the barrier in accordance with the invention, an active catalyst may be provided all over the structure. In either case, the catalyst can exert its catalyzing effect only in those areas, where the barrier layer has become or has remained transmissive for the catalyst as the result of the selective application of energy.

Any suitable imaging material may be employed in accordance with the invention, which upon the application of energy, is capable of selectively undergoing an image forming change and in which this image forming change may be promoted or retarded by the presence of a suitable catalyst. The image forming change may be a physical change in structure and/or a chemical reaction depending on the image forming mechanism of a particular imaging material.

The imaging materials useful in the invention may be organic, inorganic or elemento-organic materials. Suitable combinations or an imaging material and catalyst therefore may be found among the large group of known organic imaging systems, employing physical and/or chemical changes of the imaging material in the image forming process. Other suitable imaging materials may be found among the large group of elemento-organic imaging materials described, for instance, in copending application Ser. No. 163,891, filed on July 19, 1971, by Yew C. Chang, Stanford R. Ovshinsky and Werner W. Buechner. Herewith, special reference is made to said application Ser. No. 163,891 and the disclosure of this application is hereby incorporated in the present application. These elemento-organic imaging materials comprise a large group of compounds, which contain at least one organic group chemically linked to at least one inorganic element or group and wherein energy causes a detectable physical and/or chemical change. The reactions leading to the image formation in these materials are oftentimes greatly promoted by the presence of a catalyst or activator material. These materials are therefore particularly adaptable to the teaching of the present application and may be used with great benefit in combination with the barrier principle of the present invention.

The imaging materials useful in the present invention comprise also the memory materials described hereinafter in detail. This is an important group of imaging materials comprising organic, inorganic or inorganic-organic materials. Special reference is made herewith to U.S. Pat. No. 3,271,591 issued on Sept. 6, 1966, to S. R. Ovshinsky and to U.S. Pat. No. 3,530,441 issued on Sept. 22, 1970, to S. R. Ovshinsky. These patents describe suitable memory materials, which may be used with great benefit in the practice of the present invention. Other suitable memory materials will be described and defined hereinafter in detail.

The present invention provides a very effective control of the image without the need for imagewise application of the development energy. The benefits derived therefrom greatly increase the applicability and usefulness of a wide variety of imaging materials for imaging and for recording information, as will be explained hereinafter in detail.

Other objects, advantages and features of the invention will become apparent to those skilled in the art from the following description and claims of the invention and from the attached drawings, in which:

FIG. 7 is similar to FIG. 6, showing the completed migration of the selectively activated catalyst into contact with the layer of memory material.

FIG. 8 is similar to FIG. 7, showing the non-selective application of heat energy to the structure and the completed selective physical change of structure of the memory material achieved thereby.

Figure 1:
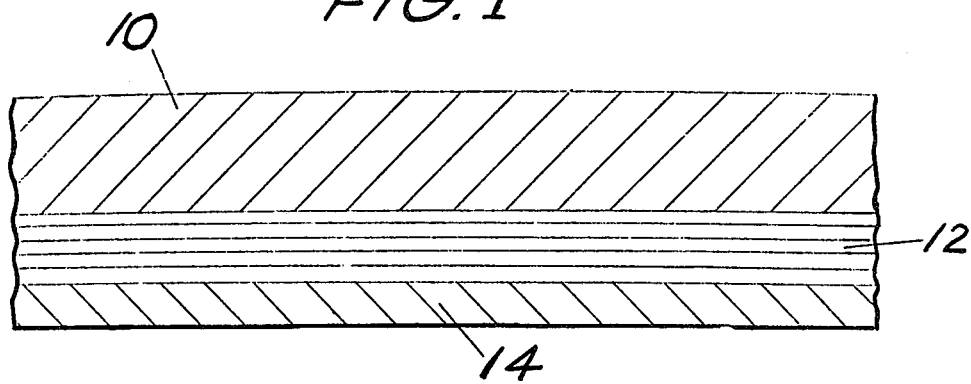
FIG. 1 is a schematic vertical sectional representation of a structure of the invention, comprising a layer of a heat developable imaging material, a barrier layer and a layer of a catalyst.

Referring to the drawings, FIG. 1 represents a structure of the invention comprising a layer 10 of an imaging material, which is capable of undergoing an image forming, detectable change upon the application of imaging energy. The imaging material is one in which the image forming change may be readily promoted by the presence of a catalyst. In contact with the underside of layer 10 of imaging material is provided a barrier layer 12. In contact with the underside of barrier layer 12 extends a layer 14 of an activated catalyst material, which, when in contact with the memory material in layer 10, is capable of promoting the image forming change of the imaging material in layer 10. The barrier layer 12 has a closed structure so that the catalyst in layer 14 cannot penetrate and cannot contact the imaging material in layer 10.

Figure 2:
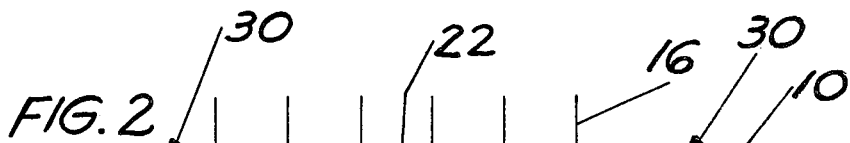
FIG. 2 is similar to FIG. 1, showing the alteration of the barrier layer by the selective application of radiant energy in a pattern.

In FIG. 2 imaging energy 16 is applied through the area 22 of the imaging layer 10 to the barrier layer 12 and has an intensity and in an amount such that the structure of the barrier layer 12 is altered in area 18 by the energy, so as to become transmissive for the catalyst in layer 14. No imaging energy is applied to areas 30 at the right and left of area 22. The selectivity of the application of imaging energy may be achieved by the use of a mask or by projection methods (not shown). The imaging energy 16, which may be, for instance, electron beam or electromagnetic radiation, including light, has an intensity lower than is required to bring about the image forming change in the imaging material in layer 10. The imaging material in layer 10 is at least in part transmissive to the energy 16. The alteration in area 18 of the barrier layer 12 caused by energy 16 may be simply a mechanical breaking up or loosening up of structure of the barrier layer 12, or it may be a chemical change in the composition of the material making up the barrier layer 12, as it may be observed in many of the conventional photosensitive compounds and compositions such as in the various available photosensitive azides, diazo compounds and the like. Areas 20 of the barrier layer 12 remain unchanged and remain, therefore, non-transmissive for the catalyst layer 14. Following the gradient through the transmissive area 18 of the barrier layer 12, the catalyst is now free to move into contact with the imaging material in area 22 of layer 10 forming nuclei 24 (FIG. 3) for the image forming change in the imaging material at the interface between layer 10 of imaging material and barrier layer 12 and by further diffusion generally throughout area 22 of the imaging material. The migration of the catalyst through the barrier layer may take place under the effect of the development energy, which may be applied simultaneously or later to bring about the image forming change in the imaging material. The migration of the catalyst may be aided or accelerated by a third kind of energy, such as an electrical field applied simultaneously with the imaging energy or with the development energy.

Figure 4:
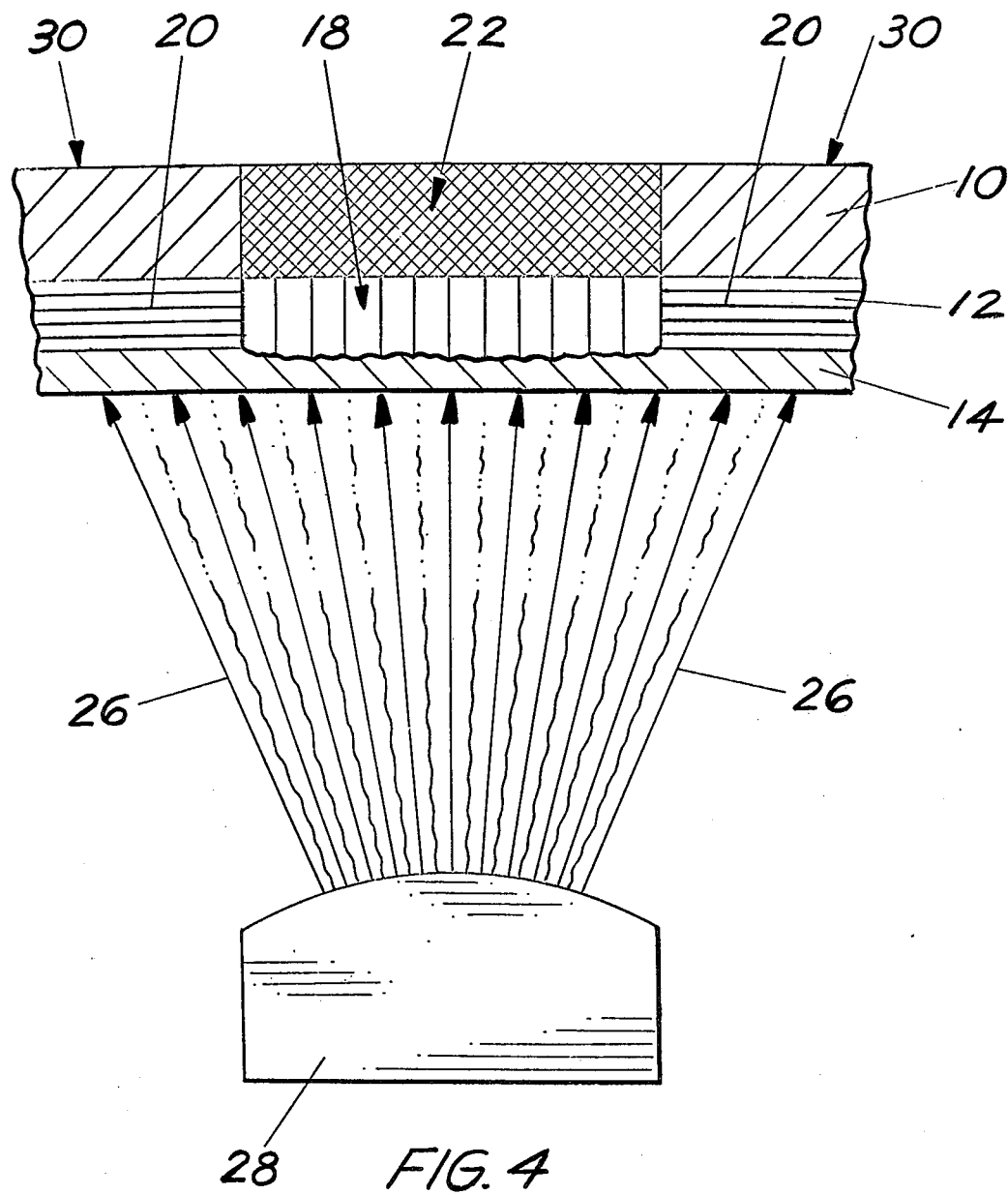
FIG. 4 is similar to FIG. 3, showing the non-selective application of development energy to the structure and the completed selected image forming change of the imaging material achieved thereby.

In FIG. 4, the energy 26 from energy source 28 is applied to the structure as a whole, without being selective as to the areas 30 and 22. The energy 26 is a kind and has an intensity high enough to bring about the image forming change in area 22, where the change is facilitated and initiated by the nuclei 24 of the catalyst. Energy 26, such as heat must on the other hand not have an intensity (temperature) high enough and a duration long enough to cause substantial physical change in areas 30 of the imaging material where there are no nuclei of activated catalyst, but where nuclei could be formed by the energy 26 (heat) in sufficient number, if energy 26 is applied at too high a level for too long a time.

By the application of energy 26, area 22 of the imaging material, approximately corresponding to exposed area 18 in the barrier layer 12, is changed to another detectable condition by undergoing a physical or chemical change under the effect of energy 26 in combination with the promoting effect of the activated catalyst providing the nuclei 24 or sites for the image forming change. By proper choice of catalyst, imaging material and intensity and duration of the application of energy 26, the differential in sensitivity of area 22 against areas 30 is quite substantial, so that high contrast can be readily achieved. In FIG. 4, the imaging material in area 22 is shown to have completed the image forming change, thus being physically and/or chemically different from the material in area 30, so that area 22 can be readily detected.

Figure 3:
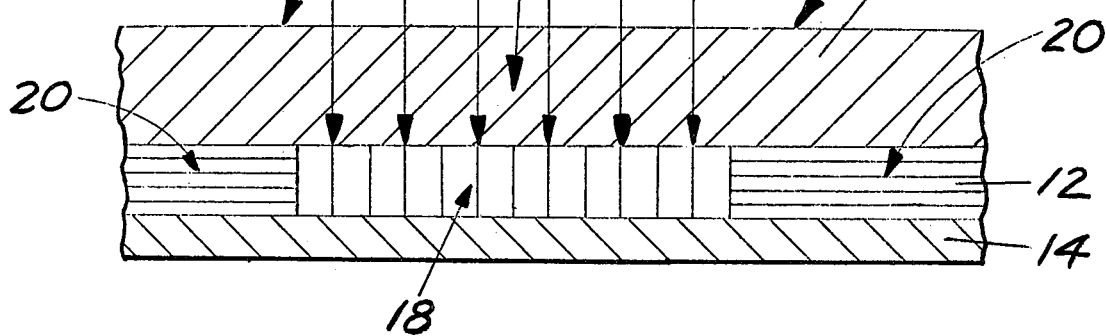
FIG. 3 is similar to FIG. 2, showing the completed migration of the catalyst through the radiated area of the barrier layer which is now transmissive for the catalyst.

In FIG. 3, the nuclei 24 formed by the activated catalyst are shown to be present in the matrix of the imaging material after completion of the application of the imaging energy 16, such as light. It is also possible that the catalyst migrates or diffuses into the matrix of the imaging material only after the beginning of the application of the development energy 26 (FIG. 4). In any case, the barrier exerts a controlling effect as to the areas in which the catalyst migrates to or into the imaging material and where it is barred or prevented or retarded from migrating from its layer 14 into contact with the imaging material, so that the situation shown in FIG. 3 applies also in the just discussed embodiment. In some cases, the barrier may merely retard the migration of the catalyst therethrough, so that a substantial differential in the rate of migration or diffusion exists between the image and the non-image areas.

In the foregoing, the catalyst in the layer 14 has been described as an active catalyst which, after migration through or across selected areas 18 of the barrier layer 12, exerts its catalytic or promoting effect on the image forming change in the imaging material in the corresponding areas. If desired, the catalytic material may also be present in layer 14 in an inactive form, provided it has the capacity of being activated by either energy 16 or by energy 26 when they are applied at the respective times, for instance by any of the mechanisms set out hereinbefore. Also in this case, the barrier layer 12 exerts its controlling function.

Another, preferred embodiment of the invention is exemplified in FIGS. 5 to 8. The imaging structure 40 comprises a top layer 42 of a memory material which is capable of undergoing a physical change in structure in response to energy. The memory material in layer 42 may be a composition of, for instance, 95% by weight selenium and 5% by weight sulfur. In contact with the underside of layer 42 is a barrier layer 44 made up of a barrier material, such as arsenic. In contact with the underside of barrier layer 44 is provided layer 46 of a catalyst material, such as silver, which in turn is provided on a light transmissive substrate 48 of, for instance, glass or Mylar.

Figure 5:
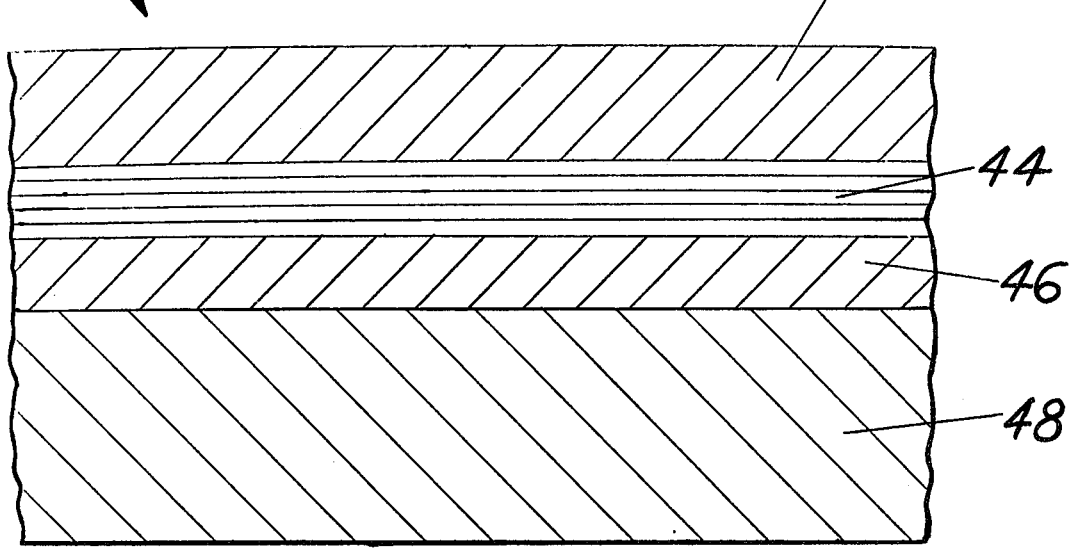
FIG. 5 is a schematic vertical sectional representation of another structure of the invention comprising a layer of a memory material, a barrier layer, a catalyst layer and an energy transmissive substrate.

The catalyst material in layer 46 is of a kind, which when activated, catalyzes or promotes the physical change in structure of the memory material in layer 42. The barrier layer is of a material which normally does not mix with either the catalyst material in layer 46 nor with the memory material in layer 42 under the conditions used in the deposition of the layers one on top of the other, so that each layer forms a separate phase as shown in FIG. 5. This does not exclude the possibility that slight intermixing of the materials occurs at the interface of adjoining layers. The material in barrier layer 44 should also not react to any substantial degree under normal conditions, such as room temperature, with either the memory material in layer 42 or the catalyst material in layer 46, but it should be capable of interacting under the effect of the energy, used for imaging or recording information in the structure of FIG. 5, with the catalyst, so as to activate the catalyst and become transmissive for the activated catalyst.

Figure 6:
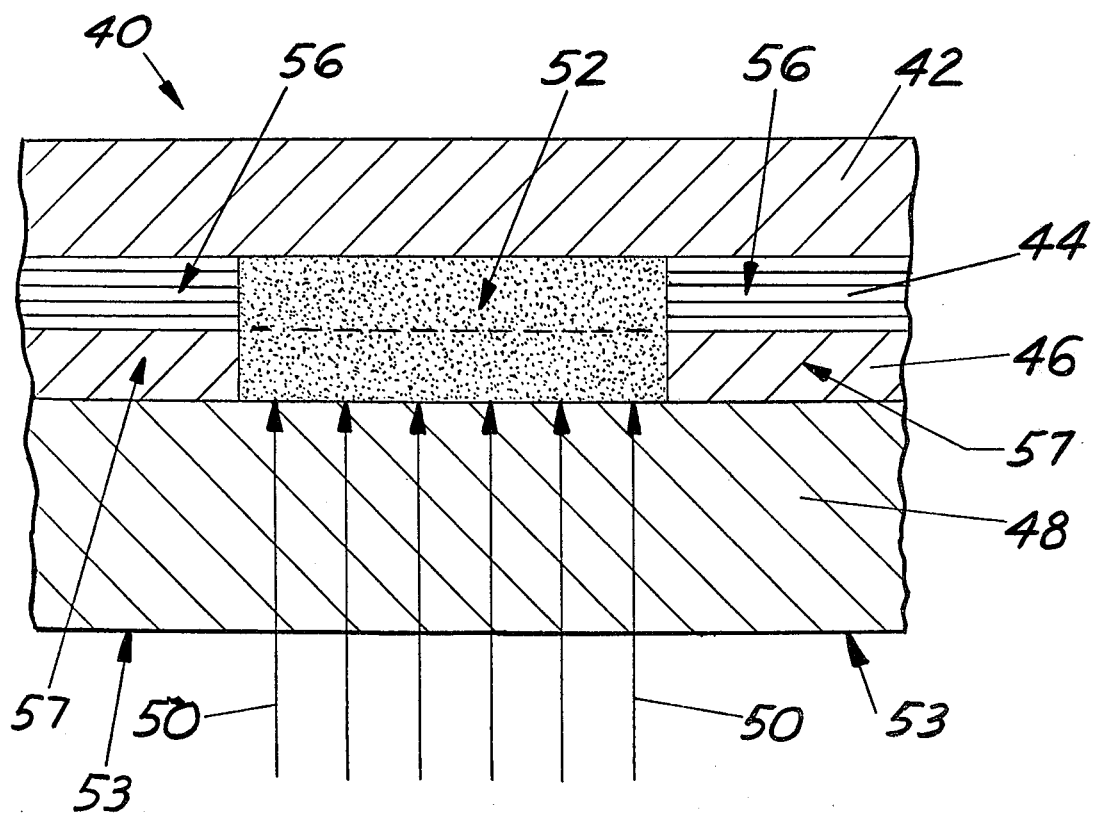
FIG. 6 is similar to FIG. 5, showing the activation of the catalyst and the alteration of a selected area of the barrier layer by the application of light to a selected area of the substrate.

When imaging energy 50, such as light, is applied imagewise through the transparent substrate 48, as shown in FIG. 6, to the catalyst layer 46 and to barrier layer 44 in area 52, the catalyst material in layer 46 and the barrier material in barrier layer 44 interact with the result, that the catalyst becomes activated in the area which has been subjected to the imaging energy. Following the gradient, the activated catalyst diffuses, or migrates in area 52, where the barrier layer has become transmissive into and through the barrier layer and in contact with the layer 42 of memory material, where it forms nuclei or crystallization sites 54 (FIG. 7). The crystallization sites 54 are shown in FIG. 7 to be located at the interface between the barrier layer 44 and the layer 42 of memory material. Catalyst may also migrate or diffuse in the irradiated area 60 through part of or all through the layer 42 of memory material. The diffusion or migration of the catalyst through the transmissive areas of the barrier layer may also be caused or accelerated by forced migration, such as in the case of applying an electrical field to a catalyst comprising charged particles. The respective areas 56 of the barrier layer 44 and the respective areas 57 of the catalyst layer 46 which have not been subjected to the imaging energy, such as light, remain unchanged, whereby the barrier layer 44 in these areas prevents the migration of the catalyst into areas 58 of the memory material (FIG. 8). Areas 58 of the memory material are therefore free from active catalyst and contain no catalyst-generated nuclei or crystallization sites.

When thereafter the structure 40 is subjected non-imagewise to heat energy 62 from heater 64 of a sufficient intensity and for a sufficient time, the physical change in structure of the memory material will take place in the area 60 of the layer 42 of memory material. Heat energy 62 may, for instance, cause crystallization of the memory material in area 60. Since the area 60 of the layer of memory material contains the nuclei 54 forming crystallization sites in this area, the crystallization proceeds rapidly all over the area 60 because of the high density of the nuclei in the area. At the same level of energy, there is no or little growth of crystals in the areas 58 of the layer 42 of memory material, because there are no or only few nuclei or crystallizations sites present or thermally generated by the applied heat. The intensity (temperature) and time of application of heat in FIG. 8 should be selected such that as little as possible crystallization or other physical change in structure occurs in non-image areas 58. In this manner high contrast is achieved by the use of the selective barrier in the structure.

Such memory materials as selenium and compositions containing selenium admixed or in chemically combined form are usually capable of producing a gray scale, if such is present in the image to be reproduced. It was found, that the method of the invention, employing the barrier layer, is capable of reproducing such gray scale in excellent manner. Better, more distinct images having a better gray scale are obtained because of the elimination or suppression of development in the non-imaged background areas. This applies likewise to any other memory material or other imaging material which is capable of rendering a gray scale.

If such materials as arsenic or arsenic-containing barrier materials or other crosslinking additives are used, certain other benefits may be derived from the barrier. Upon the application of energy 62, such as heat above the transition temperature of the memory material in layer 42, interaction of the arsenic with the memory material such as selenium occurs at the interface between these two layers in the non-image areas 58. Small amounts of arsenic or of other crosslinking agents such as germanium, phosphorus or silicon, of for instance, 1 to 5% by weight, when added or admixed to the memory material, such as selenium, cause crosslinking of molecular chains, thereby forming traps for any carriers which may be generated by the development energy 62 applied to the memory material. The same effect may also be achieved, if the arsenic or other crosslinking agent is provided in form of a thin layer in contact with the layer of memory material as is the case, when the barrier layer contains arsenic or similar crosslinking agents. Even though arsenic and selenium do not react chemically under the conditions of deposition, a narrow area of heavily crosslinked selenium may form at the interface of the two materials. This is the area, where carriers generated by the energy are trapped, requiring for further activation into nuclei considerably higher levels of energy. As a result of this situation, the thermal generation of nuclei or crystallization sites in the non-image areas 58 is further reduced. In image area 52, where the barrier containing the above named or any other crosslinking or stabilizing agent is broken down, no or very little such interaction occurs and in addition the crystallization sites or nuclei are provided by the activated catalyst in the area 60 of the layer of memory material, corresponding to the catalyst transmissive area 52 of the barrier layer, in such large numbers, that rapid crystallization occurs in area 60. In this manner, very little background crystallization occurs in non-image areas 58 under the effect of energy 52 (heat) due to the negative effect of the barrier material on the thermally induced formation of nuclei or crystallization sites in these background areas. In this manner therefore still greater contrast may be achieved by the expedient of the barrier.

In the just described embodiment of the invention, the catalyst is activated and the barrier becomes transmissive for the activated catalyst as a result of an interaction between the catalyst material and the barrier material under the effect of the imaging energy. To become effective as nuclei in the matrix or at the interface of the memory material or other imaging material with the barrier material, the activated catalyst usually migrates for a distance corresponding at least to the thickness of the layer of the barrier material. For highest efficiency and in the interest of shortening exposure and development time as much as possible, it is therefore preferred to make the barrier layer as thin as possible. It must, of course, be thick enough to exert its barrier effect so as to effectively prevent the passage of activated catalyst in the non-image areas into contact with the layer of memory material. It was found that, depending on the nature of the barrier material, of the catalyst material and of the memory material the above objectives are best fulfilled if the barrier layer has a thickness in the range from about 10 to about 10,000 Angstroms, though with special materials and for certain effects, it may be thicker or thinner than the stated range. For best results with the preferred barrier materials, the barrier layer should have a thickness ranging from about 50 Angstroms to about 1000 Angstroms. Similar considerations apply, where the barrier layer breaks up in the image areas to form islands and where the catalyst diffuses around the islands.

The layer of catalyst material may generally be made very thin, though it is desirable that the catalyst layer is continuous, providing the catalyst uniformly over all of the image areas. Only minute quantities of activated catalyst are needed to supply the nuclei and crystallization sites in the memory material or the sites for the image forming change in other imaging materials. Generally, only about 10 atoms or more are needed to make a stable nucleus. These requirements are usually met, if the layer of catalyst material has a thickness of from about 50 to about 5000 Angstroms, though the layer of catalyst may sometimes be thicker or thinner than the stated range. Making it much thicker than the above given maximum thickness usually brings no benefits and unnecessarily increases the cost of the catalyst material of the invention. Therefore, for the sake of economy and best performance, it is usually preferred that the layer of catalyst has a thickness in the range from about 100 to about 2000 Angstroms. This applies particularly also, where the imaging energy is applied from the rear of the structure through the catalyst layer. Making the catalyst layer as thin as possible, of course, increases its transmissiveness for the imaging energy so as to permit sufficient energy to strike the barrier layer for bringing about the change in transmissiveness in this layer.

The layer of memory material may have any desired thickness, though for reasons of economy it is made as thin as possible. It must only be thick enough to provide information or an image recorded therein with sufficient contrast, to fulfill the desired purpose. An important consideration is the transmissiveness of the memory material at the wave length of light used for observation of the image. Since in many instances, the physical change in structure, such as crystallization, is initiated at the interface with the barrier layer, nothing is gained by using a layer of memory material which is too thick. The unchanged upper strata of the layer do not contribute to the image or detectable information and may, in fact, interfere with the viewing or detection of the image or information. Therefore the optimum thickness of the layer of memory material varies considerably with the particular memory material used in each instance. With most memory materials layer thicknesses of from about 100 to about 100,000 Angstroms produce acceptable results though for special effects and with special memory materials the memory material may be thinner or thicker than the stated range. With the preferred memory materials of the invention, a thickness of the layer of memory material in the range from about 300 to about 5000 Angstroms permits the obtention of excellent results, with a thickness around about 4000 to 5000 Angstroms being generally most preferred for such materials which contain selenium in appreciable quantities. Similar considerations apply for the thickness of the layer containing or consisting of imaging materials other than the memory materials.

As stated hereinbefore, the energy applied in the imaging step or in the development step may also be or include electrical energy. In this case the barrier is not only effective in controlling the diffusion or migration of the catalyst. In an electric field electrons or ions may be injected into the layer of memory material by tunneling effects. The barrier may, in this case, provide a difference in the tunneling effect in the image and non-image areas. The differential tunneling caused by the difference in tunneling ability of the barrier in various areas is therefor another benefit of the selective barrier of the invention, which aids, by selectively controlling the migration or injection of carriers into the memory material in the formation of the image. The carriers, which are selectively injected into the memory material, in accordance with this differential tunneling effect, generate nuclei or initiation points for the physical changes taking place in the memory material.

The carrier injection or ion injection and the tunneling effect may be achieved by putting a voltage across the structure, e.g. by applying an electrode on each side and connecting the electrodes to a source of electrical energy. In the areas, where the barrier layer is transmissive, the carriers, such as electrons or holes, or ions migrate through the transmissive areas of the barrier into the memory material to generate nuclei or crystallization sites. In the non-transmissive areas of the barrier, such carriers do not penetrate.

The electric field may also serve to change the transmissiveness of the barrier. This applies particularly, if the electric field is applied imagewise. In this case, the carrier or ion injection may proceed simultaneously with the change of transmissiveness of the barrier layer, or it may be effected at a later time.

In those cases, where the physical change of structure is a morphological change, such as crystallization of a generally amorphous memory material as may be the case with, for instance, selenium and selenium-containing compositions and with many other memory materials useful in the invention, the transformation from the amorphous condition into the crystalline condition in the image areas takes a certain time, depending on the distance, each crystallite must grow. This is so, because the growth rate of the individual crystallite is approximately constant at a given set of conditions, such as temperature and illumination. Since for highest contrast between image and non-image areas, the former should be as highly crystalline as possible and the latter should still be as amorphous as possible, it is desirable to continue crystal growth in the image areas until essentially all of the amorphous material has been converted into crystalline material in these areas. The time required therefor is directly proportional to the distance, each crystal or crystallite has to grow for complete coverage in the image areas. This distance depends on the number of nuclei or crystallization sites provided in the matrix of memory material as has been set out hereinbefore. The greater the density of nuclei or crystallization sites, the shorter the distance each crystal or crystallite has to grow for complete coverage.

In this respect, the conditions achieved in the structures and method of the invention are ideal. Large numbers of particles of the activated catalyst have diffused through the barrier layer in the image areas into contact with or into the layer of memory material to produce the nuclei or crystallization sites in a high density. This means, that each crystal or crystallite has to grow only for a short distance until it meets up with its neighbors. This means full coverage of the crystalline form of the memory material in the plane parallel to the barrier layer is achieved in extremely short time. As stated, for highest contrast and highest possible differential in surface reflection of the final image, it is also desirable and necessary that the crystals or crystallites extend all the way up to the surface of the layer of memory material. Since the crystals or crystallites grow at about the same rate in all directions, it was found that for shortest crystallization times at full coverage, the thickness of the layer of memory material should be from about ½ to about equal the average spacing of the nuclei or crystallization sites in the plane of the layer of memory material. If the layer of memory material is thicker than that, more time is required for completion of the growth through the thickness of the layer, usually without gain in contrast or other benefit. It is therefore preferred, to make the thickness of the layer of memory material from about ½ to about equal or slightly thicker than the average distance between the nuclei or crystallization sites formed by the imaging energy in combination with the activated catalyst in the image areas.

In the methods of the prior art of producing an image, for example, on selenium by illumination and simultaneous heating above the transition temperature, a considerable number of nuclei or crystallization sites are formed thermally in the non-image areas. The crystal growth in the non-illuminated areas competes with the crystal growth in the illuminated areas to result in the reduction of the contrast, as set out hereinbefore. To produce sufficient contrast in the prior art method, illumination has to be maintained for longer periods, usually for the whole duration of thermal crystal growth. This amounts to very long exposure times to light of up to one or several minutes, which is very undesirable from a practical point of view. By the use of the catalyst and barrier layer in accordance with the present invention, illumination or exposure time can be greatly reduced, by a factor of up to 500 times or more without detriment to the contrast. This is made possible by the generation of nuclei or crystallization sites in large numbers by the catalyst in the illuminated image areas while only a small number of nuclei or crystallization sites are generated thermally in the non-illuminated areas. With the structures and method of the invention, using selenium as the memory material, exposure of for example, 1/5 second with an illumination of, for instance, 24,000 foot candles are sufficient to produce an image of maximum contrast. With other memory materials the required exposure by the imaging energy may be made considerably shorter and by proper choice of conditions, the imaging energy may be applied at much lower levels.

By considering all the benefits of the present invention and by utilizing all of the various novel features set out hereinbefore, the actual exposure time of the memory material to light of comparable intensity may be reduced by a factor of about 1000 from what has been required hereinbefore, without detriment to the required contrast in the image or other information recorded in the layer of memory material. Similar shortening of the exposure time can be achieved by the present invention, with memory materials receiving exposure to imaging energy other than light.

A typical imaging structure of the invention comprises, for instance, a thin glass substrate, whereon are deposited in this order a 0.05 micron thick layer of metallic silver as the catalyst material, a 0.005 micron thick layer of a composition of 81 atomic parts tellurium, 15 atomic parts germanium, 2 atomic parts antimony and 2 atomic parts sulfur as the barrier material and a 0.5 micron thick layer of a composition of 95 atomic parts selenium and 5 atomic parts sulfur as the imaging material.

Short exposure of this structure to light through a mask and brief heat development resulted in a sharp image of high resolution, having about $4 \times 10^7$ grains per square centimeter in the areas which had received the light exposure. When a continuous tone mask was used, an image showing an accurate rendition of the gray scale was obtained.

Similar results were obtained with a structure which comprised on a glass substrate the following layers in this order: a 0.1 micron thick layer of metallic silver as the catalyst material, a 0.01 micron thick layer of arsenic as the barrier material and a 0.05 micron thick layer of a composition of 95 atomic parts selenium and 5 atomic parts sulfur as the imaging material.

Other examples of structures prepared in accordance with the invention include a structure comprising on a glass substrate a 0.05 micron thick layer of metallic silver as the catalyst material, a 0.01 micron thick layer of arsenic as the barrier material and a 0.5 micron thick layer of selenium as the imaging material.

Another example of a structure comprising arsenic trisulfide as the barrier material contained on a glass substrate a 0.1 micron thick layer of metallic silver as the catalyst material, a 0.01 micron thick layer of arsenic trisulfide as the barrier material and a 0.5 micron thick layer of a composition consisting of 95 atomic parts selenium and 5 atomic parts sulfur.

These and other structures of the invention, containing a memory material as the imaging material formed upon brief heat development excellent images with exposures as short as 2 milliseconds of sufficient intensity.

Similar considerations apply, if imaging materials other than memory materials are used in the structures of the invention. For example, it was found, that the image forming reaction in the above mentioned elemento-organic imaging material is catalyzed by many metals such as iron, molybdenum, aluminum and many others. These metals may be so effective catalysts, that the image forming change in these materials takes place at room temperature, thereby obviating a development step. Of course, with a catalyst system of this high effectiveness, some reaction may take place also in the non-image areas. By the use of the expedient of the barrier in accordance with the present invention, the image forming change can be made selective so that no change and no reaction takes place in those areas, which have not been subjected to imaging energy. The barrier layer is used in this embodiment of the invention in the manner described herein in connection with the memory materials. Generally, the barrier materials used with these elemento-organic imaging materials should be a non-metallic material, such as a suitable semi-metal or non-metal or their energy sensitive compounds including some of the memory materials described herein. A typical barrier material useful in this embodiment of the invention is arsenic trisulfide or similar compounds, which exhibit a good light sensitivity and which are, in themselves not catalysts for the image forming reaction in these elemento-organic imaging materials. Other suitable barrier materials may be found in the group of those organic compounds which are sensitive to the imaging energy to permit upon exposure to the imaging energy the establishment of a differential in the transmissiveness of the basic material for the catalyst material. The metallic catalysts used in this embodiment of the invention may become effective in form of the metal or as metal ions and the like as described herein in connection with the memory materials.

A typical structure of this type may contain, as a suitable substrate, a layer of silver or another metal or a layer containing a metal compound, which is capable of being activated to form metal ions upon exposure to imaging energy, as the catalyst material, a layer of arsenic trisulfide or arsenic pentasulfide as the barrier material, and a layer containing in a suitable matrix an elemento-organic compound such as the compound (I), as the imaging material.

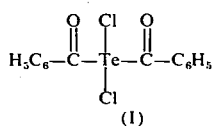

(I)

The memory material, which may be employed in accordance with the present invention, is a material which is capable of having selected portions thereof undergo a physical change in structure between at least two stable conditions. This material is normally in one of these conditions and is capable of being switched to another stable condition in response to the application of energy, such as for example, light, heat, electric field, stress, or the like, or a combination of one or more of the foregoing. In certain memory materials, there are intermediate semi-stable conditions caused by the physical change in structure of the memory material. These semi-stable conditions may also be used for imaging purposes in accordance with the present invention.

The physical changes in structure can be, for example, conformational changes, configurational changes, or positional changes in the organization or arrangement of atoms or molecules in the memory material. Typical conformational, configurational and positional changes include changes from a generally amorphous condition to a more ordered or crystalline-like condition, or the reverse; changes from one crystalline form to another crystalline form; changes in the degree of crystallinity; changes in the relative alignment of molecules or segments thereof; changes in intermolecular bonding and the like; folding up, convoluting, packing, stretching out or otherwise changing the shape or geometry of molecules; opening or closing molecular ring structures and other molecular chain scission; attachment of molecular chains; changes in the average length of molecular chains produced, for example, by coiling or uncoiling; movement of atoms or molecules from one location to another including both correlated and uncorrelated movement of adjacent atoms or molecules; creation or elimination of voids in the memory material, contraction or expansion of the memory material, breaking up or linking up of bonds between atoms or molecules, and combinations of one or more of the foregoing. As an adjunct to these physical changes in structure one or more components of a given memory material may be precipitated out of the material in, for example, a crystalline or amorphous form.

When energy is applied to certain types of memory material containing long chain polymers, particularly those with little chemical cross-linking, the atoms or molecules can flow or diffuse, exhibiting elastomeric properties. Reduction or termination of the applied energy initiates a decay in such flow or diffusion. The rate of such decay, or quench rate, is important since it is desirable to have the atoms or molecules frozen into their new positions causing a stable physical change in structure to take place prior to substantial relaxation of such memory materials to their original condition prior to the application of energy. The applied energy can, for example, break bonds between atoms or molecules or reduce Van der Waals forces or other forces between atoms or molecules, or can produce the opposite effect of linking up bonds or increasing such forces. The flow or diffusion of atoms or molecules can also be produced by thermalization processes induced by absorption of the applied energy. Where the broken bonds occur at the end of chains, for example, they may have an effect on the autohesion or on the adhesiveness of the memory material to a substrate, whereon it is contained, or on the solubility or on any other physical property.

As stated, the physical change in structure of the memory material is produced, in accordance with the invention, in the presence of a catalyst. The catalyst can serve as or generates nucleation sites so that, when energy is applied, the above-described physical changes in structure are initiated at such sites. Where the physical change in structure includes a form of crystallization, catalytic nuclei can serve as templates, epitaxially influencing the geometric form of the crystal structure. Many different forms of catalytic processes can be initiated by the applied energy, including chemical changes in the catalyst induced by photodissociation of components contained therein. Such chemical action need not continue throughout the memory material but acts only as a nucleus for producing physical changes in structure in the matrix of other materials in which the catalysts are dispersed.

Nucleation is only local and involves only the small area of direct impact of energy. Crystallization or other physical change in structure of the memory material involves mobility of other atoms moving to the nuclei to enlarge them to form the actual crystals or other stable or semi-stable structure conditions of the memory material.

Preferred memory materials are those wherein free carriers can be generated efficiently therein by the application of energy. Also, where photon energy creates electron hole pairs, it is desirable to have these carriers remain alive and not recombine for a sufficiently long period of time within which atomic movement can take place. This important parameter of memory materials is related to the relaxation time of carriers and atoms. There is normally a certain density of traps and an energy gap in any given memory material which may be changed by the above described physical changes in structure. This change in trap density and energy gap may extend the lifetime of such carriers and thereby may be assisting in freezing in a nonequilibrium distribution of carriers in the newly formed structure.

In one form of the present invention where nuclei are formed in the memory material in response to the application of energy, it is only necessary to create nuclei of a certain critical size capable of surviving any relaxation or recombination of carriers or atoms after the applied energy is removed. These nuclei thus created can act as a latent image which may be amplified and developed by the sequential or simultaneous application of energy, either in the same form as originally applied or in one or more other forms as described above, causing the growth of crystals around such nuclei.

Preferred memory materials, wherein the physical change in structure is accompanied by a transition between an amorphous and crystalline condition, are capable of existing in either of these two conditions at ambient temperatures in the region of room temperature. At these temperatures an energy barrier exists between these two conditions which may be in the form of mechanical entanglement of molecular chains or which may arise from cross-linking additives. In order to overcome this barrier it may be necessary, for example, to change molecular ring structures to molecular chains, or break crosslinks of a chemical, mechanical or other structural nature. One difference between memory materials and typical silicon oxide glasses is that the latter have high energy barriers resulting from highly cross-linked network structures having the effect of resisting devitrification or crystallization. On the other hand, the memory materials described herein are more lightly bonded allowing variations in molecular chain configurations and different atomic or molecular bond forces. These variations are achieved at lower temperatures than in the aforementioned highly cross-linked glasses and are far more responsive to activation by the application of energy. Such energy can include light which is capable of acting as a scissionary force even at the aforementioned temperature ranges to effectively lower the energy barrier between amorphous and crystalline conditions. The mobility of atoms or molecules at these temperature ranges is much higher in memory materials than in such highly cross-linked glasses thereby allowing crystal growth to occur in the memory materials in a much more rapid and controllable manner utilizing many different processes including thermal, chemical catalyst, photo-induced processes, and the like. In addition to the energy barrier that exists between the crystalline and amorphous conditions of the memory material, similar energy barriers exist between the other conditions produced by the aforementioned configurational, conformational and positional changes.

Another advantageous feature exhibited by the glassy memory materials utilized in accordance with the present invention is an exotherm above the glass transition temperature and below the temperature at which melting takes place. This characteristic aids in the ability to rapidly and controllably reduce the energy barrier between the two desired conditions of the memory material.

Hereinbefore, it has been described, that the memory material useful in the method of the present invention, is capable of undergoing a physical change in structure from one condition to at least one other condition. The memory material is normally in one of these conditions and a preferred memory material is capable of being switched between these conditions in response to the application of energy above a certain threshold, which threshold is a specific characteristic of the memory material. The application of energy below such theshold does not switch the material. The physical change in structure of the memory material produces a detectable difference in the properties of the memory material. These changes in structure may produce optical distinctions which may be visually detected, resulting directly in a useful image or there may be differences in physical properties such as a difference in solubility, a difference in the adhesion to the barrier layer, a difference in electrical properties, etc. In these cases a visually detectable image may be produced, for example, by dissolving out the memory material in those areas where it has the greater solubility in a given solvent, or by separating and removing the memory material in those areas where it has the lesser adhesiveness to its substrate. Other differences in the physical properties of the memory material, such as in the electrical properties may be directly used for read out, for instance, by the use of suitable equipment responding to these electrical or other physical differences.

These changes may also include changes in the electrostatic properties of the memory material. Information recorded in the memory material in form of a changed physical structure may also be made more distinct or more readily visible by treating the imaged layer of memory material with other substances, such as inks or dyes or pigments. As a result of differential absorption, adhesion or electrostatic attraction these materials will be retained by the memory material being in one condition to a different degree than by the memory material being in the other condition. These materials may, in this manner, produce a more readily detectable or visible image.

The highest degree in the difference of the physical properties of the memory material is generally obtained, if the physical change in structure of the memory material includes a morphological change, for example, the transformation of generally amorphous memory material into a crystalline form or vice- versa the transformation of crystalline memory material into a generally amorphous form. This includes also transformation of memory material having one crystal form into another crystal form, whereby the physical differences of these different crystal forms, such as differential solubility, differential adhesion to the substrate, difference in optical properties, difference in absorption or adhesion of a material, such as an ink, applied thereto and the like, are utilized in the formation and detection of the image and of the information, represented by it. In some cases, such detectable differences may be observed even though, for instance, an amorphous or a crystalline memory material does not change its gross appearance. In these cases, subtle physical changes may take place, which can be detected or read out, for instance, optically or electrically or by other suitable detection methods.

Suitable memory materials, which are capable of undergoing a detectable physical change in structure under the effects of energy, can be found in the various organic and inorganic classes of materials being responsive to energy. For imaging purposes, especially those utilizing electrical read-out, the inorganic materials, especially the semiconductor memory materials are generally preferred, because of their usually quite high opacity and their generally favorable electrical properties. Excellent results are obtained with those memory materials, which comprise at least one chalcogenide element other than oxygen. Suitable compositions include selenium and selenium compositions comprising selenium and one or more other elements. Among these may be mentioned especially selenium compositions which contain up to about 15% by weight or more sulfur. These compositions have a higher sensitivity to light than selenium itself and make possible still shorter exposure times to light for the generation of a latent image of sufficient intensity for producing an excellent image by heat development. Other suitable memory materials may include the materials listed in the above mentioned U.S. Pat. Nos. 3,271,591 and 3,530,441 both issued to Stanford R. Ovshinsky and in the above mentioned patent application Ser. No. 63,404. Other suitable compositions of memory materials are certain glassy compositions such as compounds and compositions containing arsenic and compositions of germanium and tellurium, containing, if desired, also small amounts of other elements such as antimony or sulfur. To mention only a few, typical memory materials which are operable in the invention include for instance compositions (parts being by weight) of 15 atomic parts germanium, 81 atomic parts tellurium, 2 atomic parts antimony and 2 atomic parts sulfur or a composition of 83 atomic parts tellurium and 17 atomic parts germanium; a composition of 92.5 atomic parts tellurium, 2.5 atomic parts germanium, 2.5 atomic parts silicon and 2.5 atomic parts arsenic; a composition of 95 atomic parts tellurium and 5 atomic parts silicon; a composition of 90 atomic parts tellurium, 5 atomic parts germanium, 3 atomic parts silicon and 2 atomic parts antimony; a composition of 85 atomic parts tellurium, 10 atomis parts germanium and 5 atomic parts bismuth; a composition of 85 atomic parts tellurium, 10 atomic parts germanium, 2.5 atomic parts indium and 2.5 atomic parts gallium; a composition of 85 atomic parts tellurium, 10 atomic parts silicon, 4 atomic parts bismuth and 1 atomic part thallium; a composition of 80 atomic parts tellurium, 14 atomic parts germanium, 2 atomic parts bismuth, 2 atomic parts indium and 2 atomic parts sulfur; a composition of 70 atomic parts tellurium, 10 atomic parts arsenic, 10 atomic parts germanium and 10 atomic parts antimony; a composition of 60 atomic parts tellurium, 20 atomic parts germanium, 10 atomic parts selenium and 10 atomic parts sulfur; a composition of 60 atomic parts tellurium, 20 atomic parts germanium and 20 atomic parts selenium; a composition of 60 atomic parts tellurium, 20 atomic parts arsenic, 10 atomic parts germanium and 10 atomic parts gallium; a composition of 81 atomic parts tellurium, 15 atomic parts germanium, 2 atomic parts sulfur and 2 atomic parts indium; a composition of 90 atomic parts selenium, 8 atomic parts germanium and 2 atomic parts thallium; a composition of 85 atomic parts selenium, 10 atomic parts germanium and 5 atomic parts antimony; a composition of 85 atomic parts selenium, 10 atomic parts tellurium and 5 atomic parts arsenic; a composition of 70 atomic parts selenium, 20 atomic parts germanium, 5 atomic parts thallium, and 5 atomic parts antimony; a composition of 70 atomic parts selenium, 20 atomic parts germanium and 10 atomic parts bismuth, a composition of 95 atomic parts selenium and 5 atomic parts sulfur and many more.

Single elements can be used as the memory material under certain conditions, for example, selenium. This type of memory material may be present in form of rings or in form of open chains formed by a plurality of atoms linked in form of a molecule. The ratio of rings to open chains can be affected in a manner, which increases the sensitivity of the material. It may also increase the speed at which the physical changes or the transformation from one morphological form to another take place. For example, the addition of tellurium, which is isomorphous with selenium, aids in creating a chain-like condition of the selenium molecules, thus reducing the proportion of rings present in the material.

The foregoing listing of examples of memory materials represents merely a small selection of the large number of memory materials which may be used in the practice of the invention and which may be provided in the structure of the invention.

Generally preferred are those memory materials which can be readily provided, in form of the desired thin layers, on the barrier layer. They may be applied, for example, by thermal vacuum evaporation techniques, by sputtering, by pressing or by the application of the solution of the material in a solvent with subsequent evaporation of the solvent or by other suitable procedure. Preferably the memory materials are applied in form of a layer of generally amorphous memory material. Other imaging materials may be applied in a manner customary with these materials, such as by the use of a doctor knife.

Suitable barrier materials may be found in various classes of organic and inorganic materials including organometallic compounds and may be selected on the basis of their characteristic, that they control the transmissiveness of a given catalyst material upon the application of energy.

The barrier may serve as a transfer intermediary, which couples the memory material and the catalyst. Generally, the barrier material effects a phase separation between the memory material and the catalyst.

Excellent barrier effects can usually be achieved with such barrier materials, which comprise halogen in chemically combined form and especially various halides and metal halides especially alkali metal halides such as potassium bromides. Other suitable barrier materials are compositions comprising arsenic and/or sulfur, such as a layer of elementary arsenic or elemental sulfur, or a layer comprising for instance, arsenic monosulfide, arsenic disulfide, arsenic trisulfide, arsenic pentasulfide or a mixture of arsenic and sulfur in any desired ratio. As stated above, arsenic is one of the barrier materials which is capable of retarding the physical change in structure of the memory material in response to energy in those areas which are not activated by the presence of the nuclei provided by the activated catalyst. Generally, all those materials may be used as a barrier material, which are capable of controlling the transmissiveness of catalyst by the selective application of energy, and which in themselves do not catalyse the image forming change in the imaging material.

The foregoing described barrier materials comprising halogen or arsenic and/or sulfur have also the capacity of promoting the formation of or they may have the capacity of actually producing photo-dissociable or photo-reducible salts from certain catalyst precursors such as metallic catalyst materials, when they are subjected to electromagnetic radiation. By applying this energy imagewise, the photo-dissociable or photo-reducible salts are formed only in the desired image areas. When these photo-dissociable salts dissociate under the effect of light, the ions diffuse or migrate through the barrier layer into contact with the memory material where they may form nuclei or sites for the initiation of the desired physical change in structure of the memory material. If desired, the migration of the ions may be aided by other energy, such as by a suitably applied electrical field.

Other suitable barrier materials simply change, under the effect of the imaging energy, their transmissiveness for the catalyst material being comprised in the catalyst layer. Certain memory materials, applied as a thin layer intermediate to the image-forming top layer of another memory material and to the layer of catalyst material, may be effective as a barrier material. It is of course desirable that the intermediate barrier layer of memory material has a transition temperature higher than the top layer, so that it does not undergo a physical change in structure under imaging conditions. It is generally preferred that the second memory material forming the barrier layer has a chemical composition different from that of the memory material in the top layer. Under the proper conditions, the second memory material forming the barrier layer, may also be a separate thin layer, having the same composition as the memory material in the top layer. In this case, this thin layer of memory material has a critical thickness in order to control diffusion of the catalyst. It was also found that the presence of the above mentioned elements, such as sulfur or arsenic in such barrier layer of memory material, furthers the formation of photo-dissociable and photo-reducible salts, which by the above described mechanism form ions and thereafter nuclei when they contact the top layer of memory material. A typical barrier material of this type comprises a composition of 81 atomic parts tellurium, 15 atomic parts germanium, 2 atomic parts sulfur and 2 atomic parts antimony. The barrier materials of this type were found to be especially beneficial in combination with metallic catalyst material for example silver, which is one preferred catalyst material because of the photo-responsiveness of its compounds.

In the case that the catalyst material is one which is activated by the imaging energy such as light, the preferred barrier material is one which is capable of permitting the passage or cooperating in the transferral of the activated or photo-activated catalyst material and which at the same time prevents or retards the passage of the activatable but unactivated catalyst material per se. In the most preferred embodiment of the invention, the barrier layer comprises a material which is capable of forming at the interface with the catalyst material an energy activatable material when the barrier material is subjected to the imaging energy. In the case of light as the imaging energy, a suitable barrier material containing sulfur may, for instance, form with a metallic silver catalyst material silver sulfide which in turn may be activated by the imaging light. Of course, the energy-activatable or photoactivatable compound may also be deposited in the layer of catalyst material as such, so that the ions, formed by the energy or light from the dissociable catalyst compound, migrate into and through the barrier material in all those areas where the barrier material is transmissive for the activated catalyst material by the application of the imaging energy, such as light.

As stated above, the third layer containing the catalyst material, may comprise a catalyst which is capable per se of catalyzing the physical change in structure of the memory material or other image forming change in the imaging material in the top layer. It may be an inorganic or an organic material, including organo-metallic compounds. It may also be in the form of a photo-dissociable salt or of a photo-reducible salt which when it is subjected to the imaging energy, such as light, becomes activated as in the case of silver iodide. In these instances, the barrier material must be one, which effectively prevents or retards passage of the active catalyst material in the non-image areas but which permits passage of the active catalyst in the image areas. This type of catalyst may be used, for instance, in the case where a non-transmissive barrier material becomes transmissive to the active catalyst when it is subjected to the effect of the imaging energy.

Inactive catalysts or catalyst precursors which may become activated and which migrate through the barrier include the metallic catalyst materials such as silver, copper, thallium, mercury, cadmium and other metals. Other suitable catalysts include alkali metals, alkali metal ions, halogens and the like.

The just mentioned metals in themselves may or may not be capable of catalyzing the physical change in structure of the memory material. However, when a memory material such as selenium or a selenium-containing composition is deposited, in accordance with the prior art, directly onto the metal layer, interaction and sometimes, as in the case of silver, chemical reaction occurs to form silver selenide. The silver selenide formed at the interface between the two materials forms nuclei and crystallization sites for the selenium.

When the barrier layer of the invention is placed between the layer of memory material and the layer of the catalyst material for phase separation, this interaction does not take place. By suitable choice of the barrier material in the barrier layer, there need be no essential chemical reaction between the metallic catalyst material and the barrier under the conditions of deposition and in the absence of the energy of the kind and of the level, to be used for imaging. Thus the barrier layer effectively prevents contact of the metallic catalyst material such as silver, or of the readily mobile alkali ions with the memory material or other imaging material in the top layer. Therefore, in the case of selenium no silver selenide and no nuclei or crystallization sites are generated in the absence of the imaging energy. In accordance with this embodiment of the invention, the composition of the barrier material in the barrier layer is selected such that it is capable of promoting, under the effects of the energy used for imaging, such as light, the conversion of the metal into ionic form. This may be, for instance, in the case of silver the reaction of the silver with one of the components of the barrier material, for instance, with the arsenic or sulfur contained in the barrier material. By the effect of the imaging energy, such as light, the silver compound formed in this manner, dissociates and the silver ions diffuse through the barrier layer into contact with the memory material, where they form nuclei and crystallization sites for the selenium. Atoms of smaller size, like those of the alkali metals diffuse even more readily.

Similar effects may also be achieved with various metallic and non-metallic materials, which are capable of reaction with the barrier materials under the effect of the imaging energy and which are capable of providing or of setting free from the barrier layer or from a separate layer ions or other particles which, when in contact with a layer of memory material, are capable of promoting or catalyzing the physical change in structure of the memory material. Similar effects may also be obtained if the layer of catalyst material comprises a photo-dissociable or photo-reducible salt, which upon subjecting it to actinic radiation in the image areas, dissociates and forms the ions, which selectively migrate through the barrier layer to catalyze the physical change in structure of the memory material in the top layer.

The most preferred catalyst material is a material, which is capable of forming by energy-induced chemical reaction an energy-dissociable or energy-reducible and most preferably a photo-dissociable or photo-reducible compound. The dissociable or reducible compound is dissociated or reduced by the imaging energy to form the activated catalyst material, which after selective passage through the barrier forms nucleation sites in the layer of memory material. As is readily apparent, the invention requires that the activated catalyst and the barrier material are mutually compatible, so that the activated catalyst may readily diffuse through the barrier.

Similar considerations, as described hereinbefore in detail for the memory material, apply for the selection of suitable barrier materials and catalyst materials or catalyst precursors when imaging material other than memory materials are used in accordance with the principles of the invention. In this case a layer of a catalyst material may be provided, which promotes, activates or catalyzes the particular image forming reaction in the imaging material. As described before, the catalyst may be deposited in its layer in form of a catalyst precursor. In combination with the selected catalyst, one will select a barrier material which changes its transmissiveness for the selected catalyst upon the application of suitable imaging energy. The comments made herein in connection with the structures comprising as the imaging material a memory material, apply suitably modified also to any other imaging material, which may be used in accordance with the invention.

Instead of using heat energy or the like for the development of these materials, chemical energy represented by the reactivity of a chemical developer may be used as the energy to bring about development of the actual image, as may be appropriate with a given imaging material.

As stated, by the use of an active or activatable catalyst material in combination with the barrier layer which is selectively transmissive for the activated catalyst, the desired physical change in structure of the memory material proceeds essentially only in those areas, where the catalyst migrates in a gradient or as the result of applied energy such as an electrical field through the barrier to form nuclei or other sites for the initiation of the desired physical change in structure of the memory material in the desired selected areas.

The actual physical change in structure of the memory material in the selected areas from one condition to another condition may be effected at the same time that the transmissiveness of the barrier for the catalyst is changed by the selective application of imaging energy. To achieve this, the imaging energy may be applied at a level and in an amount sufficient to bring about the physical change in those areas of the memory material which are contacted by the activated catalyst.

Two or more forms of energy may be applied imagewise or imaging energy is applied imagewise and the development energy required for bringing about the actual physical change is applied to the structure as a whole.

However the most benefit is derived from the barrier in those instances, where the barrier layer and, if desired, the catalyst layer are subjected imagewise to imaging energy, of a kind and at a lower level, than is required for bringing about the actual physical change in structure of the memory material i.e. at a level below the above mentioned threshold. The imaging energy is sufficient, to cause the changes in the barrier layer to imagewise alter transmissiveness for the catalyst, and if applicable, activate the catalyst as described above to form a latent image. In a second application of energy which may be simultaneous or in series the latent image is thereafter developed by the application of higher levels of energy of the same or of a different kind or by a combination of different energies such as by heat or by heat and light. In the second step of applying energy, it is of course not required to apply the energy imagewise. The development energy may be applied to the whole structure uniformly to produce imagewise the physical change in structure of the memory material only in those areas, where the catalyst, by contacting the memory material provides the nuclei or sites for the initiation of the physical change in structure of the memory material or other imaging material.

The actual development of the image may be achieved by the application of one single kind of energy, such as heat or by the application of a combination of different forms of energy, whereby the different forms of development energy may be applied simultaneously or successively to the whole structure or, if desired, only to the image areas.

Other forms of energy useful for the development of the latent image comprise electric energy, electromagnetic radiation, particle beam energy and the like. If the memory material undergoes the physical change in structure upon the application of energy above a certain threshold, the developing energy should be applied above this threshold. It is to be noted thereby, that the threshold in the areas comprising the latent image formed by the catalyst nuclei may be lower than the threshold in the non-imaged areas.

The imaging energy applied for controlling the transmissiveness of the barrier layer for the catalyst may consist of a single kind of energy, such as light energy, or it may comprise a combination of two or more different forms of energy. So, for instance, light energy may be applied in addition to an electrical field, where the light energy merely controls and triggers an electrical field to become effective. In this manner, only small amounts of light energy are needed, because the actual alteration of the transmissiveness of the barrier layer is effected by the electrical energy of the electrical field. Any other combination of two or more forms of energy may be used in similar manner.

As indicated above, the imaging energy may be applied through the top layer of the memory material, if the latter is at least in part transmissive for the type of energy employed for the imaging. Preferably, it is applied from the rear through the catalyst layer, the latter layer being usually very thin, and therefore being transmissive for most kinds of energy, which may be used for the imaging. If the structure of the invention comprises a substrate, the latter should be transmissive for the imaging energy if the imaging is effected through the substrate. Transparent substrates are therefore preferred in these instances. With many of the memory materials actinic radiation or light is excellently suited for the imaging step, particularly in those cases where the catalyst material comprises a photo-dissociable or photo-reducible salt or where this type of energy promotes the interaction or photochemical reaction of the catalyst material with at least one component of the barrier material. Depending on the nature of the catalyst material and of the barrier material, also other types of imaging energy may be used, such as electron beam energy, laser energy, or electrical energy. The electrical energy may also serve for driving, by setting up an electric field, the activated catalyst such as ions through the barrier layer into contact with the layer of memory material. The catalyst may be contained in an electrode, from where it may be driven by an electrical field through the open or transmissive areas of the barrier layer into contact with the layer of memory material.

The structure of the invention comprising the memory materials may be used as a photographic material for the production of images by short exposures. The image may thereafter be developed by simple application of energy, such as heat, to the structure. No wet treatment is required and the finished images are obtained in short periods of time, requiring developing times of one minute or less. However, if desired, subsequent treatment, including wet treatments of various forms, may be included.

The structures comprising the memory materials may also be used for recording information, which may be retrieved visually or by suitable read-out equipment comprising means such as scanning beams and the like. Many of the memory materials useful as imaging materials in the invention are reversible. This makes possible correction of the recorded information. The structures and the method of the present invention may be used in many more practical applications as may come readily to mind. A particular advantage of these structure and of the method for their use in imaging or recording information is, that no fixing of the images is needed and no fixing step need be included. The image may be exposed to normal room light as soon as development is completed.

The new imaging materials of the invention comprising the memory material provide a high photographic gain. For each photon and for each activated catalyst unit generated, a very considerably physical change in structure of the memory material, involving a large number of atoms or molecules is caused in the development step. For instance, in the case of crystallization, each catalyst-generated nucleus forms a crystal or crystallite of appreciable size. This results not only in a gain in contrast but also in a considerable gain in speed of the system. This applies in similar manner to many other imaging materials, which may be used in accordance with the invention, especially to the above mentioned elemento-organic imaging materials.

Contrary to this, the known imaging system based on the photochemical reaction of, for instance, arsenic sulfides with silver produces for each photon only one molecule of the photolytic product. This system results therefore in a very low photographic speed.

The imaging structures of this invention, comprising imaging materials other than the described memory materials may be used in the usual manner and for the established uses such as for producing images in the camera, for copying images and for recording information by any of the well known methods.

Numerous other modifications may be made to various forms of the invention described herein without departing from the spirit and scope of the invention.

We claim:

1. A structure comprising a layer comprising an imaging material which is capable of an image forming change upon the application of energy and wherein the image forming change can be promoted by a catalyst material, a barrier layer, comprising a barrier material, in contact on one side with said layer of imaging material, and in contact with said barrier layer on the opposite side thereof a layer comprising a catalyst material, which is capable of traversing the barrier layer and of promoting, in activated form, the image forming change in said layer of imaging material, wherein the layer of barrier material has the capacity of controlling transmission of the catalyst material from the layer of catalyst material to the layer of imaging material in response to energy.

2. The structure of claim 1, wherein said imaging material is an elemento-organic imaging material.

3. The structure of claim 1, wherein said imaging material is a memory material.

4. The structure of claim 1, wherein the barrier material in said barrier layer is non-transmissive for said catalyst, and wherein the barrier material has the capacity of becoming transmissive for said catalyst, when said structure is subjected to energy.

5. The structure of claim 1, wherein the barrier material in said barrier layer is capable of reacting, under the effect of energy applied thereto, with the catalyst material in said catalyst layer.

6. A structure comprising a layer of a memory material, which is capable of undergoing a physical change in structure in response to energy, a barrier layer comprising a barrier material in contact on one side with said layer of memory material, and in contact with said barrier layer on the opposite side thereof a layer comprising a catalyst material, which is capable of traversing the barrier layer and of promoting, in activated form, the physical change in structure in said memory material, wherein the layer of barrier material has the capacity of controlling the transmission of the catalyst material from the layer of catalyst material to the layer of memory material in response to energy.

7. The structure of claim 6, wherein said barrier layer comprises in selected areas barrier material which is non-transmissive for said catalyst and in other selected areas barrier material which is transmissive for said catalyst.

8. The structure of claim 6, wherein the said barrier material has the capacity of controlling the transmission of the catalyst in response to actinic radiation.

9. The structure of claim 6, wherein the said catalyst material in said layer is inactive, and having the capacity of being activated in response to the energy causing the change in the transmission of the catalyst.

10. The structure of claim 6, wherein the physical change in structure of the memory material comprises a morphological change.

11. The structure of claim 6, wherein the memory material comprises a chalcogenide element other than oxygen.

12. The structure of claim 6, wherein the memory material comprises selenium.

13. The structure of claim 6, wherein the barrier layer comprises sulfur.

14. The structure of claim 6, wherein the barrier layer comprises arsenic.

15. The structure of claim 6, wherein the barrier layer comprises arsenic and sulfur.

16. The structure of claim 6, wherein the barrier layer comprises a material, which is capable of retarding said physical change in structure of the memory material in response to energy.

17. The structure of claim 1, wherein the barrier layer comprises a material which is capable of promoting the formation of a photo-dissociable material from said catalyst material.

18. The structure of claim 1, wherein the barrier layer comprises a material, which is capable of promoting the formation of a photo-reducible material from said catalyst material.

19. The structure of claim 1, wherein the barrier layer comprises a material which is capable of reducing its transmissiveness for said catalyst material under the effect of energy.

20. The structure of claim 1, wherein the barrier layer comprises a material which is capable of increasing its transmissiveness for said catalyst material under the effect of energy.

21. The structure of claim 1, wherein the barrier layer comprises a material, which is capable of increasing its transmissiveness for said catalyst material under the effect of actinic radiation.

22. The structure of claim 1, wherein the barrier layer comprises a material, which is capable of chemically reacting with said catalyst material at their interface under the effect of energy.

23. The structure of claim 1, wherein the barrier layer comprises a material, which is capable of chemically reacting with said catalyst material at their interface under the effect of actinic radiation.

24. The structure of claim 1, wherein the barrier layer comprises a material, which is capable of promoting under the effect of energy the conversion of the catalyst material at their interface into an ionized form.

25. The structure of claim 1, wherein the barrier layer comprises a material, which is capable of promoting, under the effect of actinic radiation, the conversion of the catalyst material at their interface into an ionized form.

26. The structure of claim 1, wherein the catalyst material comprises a metal and the barrier layer comprises a material which is capable of promoting under the effect of actinic radiation the conversion of said metal at their interface into metal ions.

27. The structure of claim 1, wherein the catalyst material comprises a metal, which is capable of forming a photo-dissociable salt and the barrier layer comprises a material which is capable of promoting under the effect of energy the conversion at their interface of said metal into metal ions.

28. The structure of claim 1, wherein the catalyst material comprises a metal.

29. The structure of claim 1, wherein the catalyst material comprises a metal, which is capable of forming a photo-dissociable salt.

30. The structure of claim 6, wherein the catalyst material comprises a material selected from the group consisting of silver, copper, thallium, cadmium, mercury, alkali metals, and the halogens.

31. The structure of claim 6, wherein the memory material is generally amorphous, having the capacity of crystallizing under the effect of energy.

32. The structure of claim 31, wherein said catalyst material comprises a metal, which is capable of forming ions, which in turn are capable of forming nucleation sites for the crystallization of said memory material.

33. The structure of claim 31, wherein said catalyst material comprises a metal, which is capable of forming ions, which in turn are capable of forming nucleation sites for the crystallization of said memory material, and wherein the barrier layer comprises a material which is capable of promoting, under the effect of energy, the conversion of said metal into metal ions.

34. The structure of claim 6, wherein the barrier layer comprises halogen.

35. The structure of claim 6, wherein the barrier layer comprises a halide.

36. The structure of claim 6, wherein the barrier layer comprises an alkali metal halide.

37. The structure of claim 6, wherein the barrier layer comprises potassium bromide.

38. The structure of claim 6, wherein the barrier layer comprises a second memory material, which is capable of undergoing a physical change in structure in response to energy, said second memory material having a chemical composition different from that of the first memory material and having a transition temperature which is substantially higher than the transition temperature of said first memory material.

39. The structure of claim 38, wherein the said second memory material in the said barrier layer comprises sulfur.

40. The structure of claim 38, wherein the said second memory material in the said barrier layer comprises sulfur and wherein said catalyst material comprises metallic silver.

41. The structure of claim 1, wherein the catalyst material comprises a photo-dissociable salt.

42. The structure of claim 1, wherein the catalyst material comprises a photo-reducible salt.

43. A structure comprising a layer of memory material, which is capable of undergoing a physical change in structure in response to the effect of energy, a layer of a barrier material in contact on one side with said layer of memory material, and a layer of an inactive catalyst material in contact with said layer of a barrier material on the opposite side thereof, wherein the layer of barrier material has the capacity of controlling the transmission of the catalyst material from the layer of catalyst material to the layer of memory material in response to energy, and wherein the inactive catalyst material is a material, which when activated, and in contact with said layer of memory material catalyzes the physical change in structure of the memory material, and wherein the barrier material is a material which is capable of interacting with said inactive catalyst material, when subjected to imaging energy, to produce an activated catalyst material and allow transmission thereof to the layer of memory material.

44. The structure of claim 43, wherein said layer of barrier material comprises at least one member selected from the group consisting of arsenic, the monosulfide of arsenic, the disulfide of arsenic, the trisulfide of arsenic, the pentasulfide of arsenic, a mixture of arsenic and sulfur, and potassium bromide.

45. The structure of claim 43, wherein said layer of catalyst material comprises a metal which is a member selected from the group consisting of silver, copper, thallium, cadmium and mercury.

46. The structure of claim 43, wherein the layer of said memory material comprises selenium.

47. The structure of claim 43, wherein the layer of said memory material comprises selenium, the layer of the barrier material comprises arsenic and the layer of catalyst material comprises silver.

48. The structure of claim 43, wherein the layer of said memory material comprises selenium, the layer of the barrier material comprises arsenic trifulsifde and the layer of the catalyst material comprises silver.

49. The structure of claim 43, wherein the layer of said memory material comprises selenium and up to 15 atomic percent by weight sulfur.

50. The structure of claim 1, wherein the said layer of the catalyst material is disposed on a substrate.

51. The structure of claim 50, wherein the said substrate is light transmissive.

52. The structure of claim 1, wherein said barrier layer has a thickness of from about 50 to about 10,000 Angstroms.

53. The structure of claim 1, wherein said barrier layer has a thickness of from about 100 Angstroms to about 1000 Angstroms.

54. The structure of claim 1, wherein the layer of said imaging material has a thickness of from about 1000 to about 10,000 Angstroms.

55. The structure of claim 1, wherein the layer of said imaging material has a thickness of from about 3000 to about 5000 Angstroms.

56. The structure of claim 6, wherein the layer of said memory material has a thickness of about 5000 Angstroms.

57. The structure of claim 1, wherein the said layer comprising the catalyst material has a thickness of from about 50 to about 5000 Angstroms.

58. The structure of claim 1, wherein the said layer comprising the catalyst material has a thickness of from about 100 to about 500 Angstroms.

59. The method of producing an image comprising the step of providing a structure which comprises a layer of a memory material which is capable of undergoing a physical change in structure in response to energy; a barrier layer in contact on one side with said layer of memory material, and in contact with said barrier layer on the other side thereof a layer comprising a catalyst material which is capable of traversing the barrier layer and of promoting, in activated form, said physical change in structure of said memory material upon contacting the memory material, wherein said barrier layer has the capacity of controlling the transmission of the catalyst material from the layer of catalyst material to the layer of memory material under the effect of energy, the step of applying a pattern of imaging energy to selected areas of said structure to control the transmission of the catalyst material so as to permit the catalyst material to contact said memory material in selected areas thereby promoting the physical change in structure in those areas of said memory material where it is contacted by said catalyst material, when said memory material is subjected to energy to bring about said physical change in structure.

60. The method of claim 59, which comprises the further step of applying energy to said structure for bringing about said physical change in structure in selected areas of said memory material.

61. The method of claim 59, in which said imaging energy in said pattern of energy comprises actinic radiation.

62. The method of claim 59, in which said catalyst material contacting said memory material forms nuclei for said physical change in structure in said memory material in those areas which correspond to the areas of the barrier material which have been subjected to said energy, and in which energy is applied to said structure in an additional step to cause said physical change in structure to take place in the areas which correspond to the imaging energy.

63. The method of claim 62, in which said energy applied to the structure in said additional step comprises heat.

64. The method of claim 62, in which said physical change in structure of the memory material comprises a morphological change.

65. The method of claim 62, in which said memory material is generally amorphous and in which said physical change in structure of the memory material comprises crystallization of said amorphous memory material under the effect of heat comprised in the energy in said additional step of applying energy.

66. The method of claim 65, in which said memory material comprises selenium.

67. The method of claim 59, in which imaging energy comprising actinic radiation is applied to the structure in a pattern and in addition energy comprising heat is applied to the structure.

68. The method of claim 67, in which said actinic radiation and said heat are applied simultaneously.

69. The method of claim 67, in which first said actinic radiation is applied to selected areas of said structure and thereafter said heat energy is applied to the structure in a separate step.

70. The method of claim 59, in which the said layer of memory material is transmissive to the said imaging energy and the imaging energy is applied through said layer of memory material onto the said barrier layer in form of a pattern in selected areas of said structure.

71. The method of claim 61, wherein the structure comprises a substrate which is transmissive for actinic radiation, said substrate being in contact with said layer comprising the catalytic material, and in which method the actinic radiation is applied from the substrate side of the structure in form of a pattern in selected areas of said structure.

72. The method of claim 59, in which said catalyst material is present in an inactive form and in which said imaging energy activates said catalyst and causes the activated catalyst to contact said memory material in the selected areas in accordance with said pattern of energy, thereby promoting the physical changes in said memory material.

73. The method of claim 59, in which the said imaging energy, applied in a pattern, comprises a combination of at least two different forms of energy.

74. The method of claim 73, in which said combination of two different forms of energy comprises actinic energy and electrical energy.

75. The method of claim 60, in which said energy bringing about said physical change in structure of said memory material in those areas where it is contacted by said catalyst material, comprises a combination of at least two different forms of energy.

76. The method of claim 75, in which said combination of two different forms of energy comprises heat and light energy.

77. The method of claim 60, in which said energy bringing about said physical change in structure of said memory material, is applied simultaneously with the application of said imaging energy.

78. The method of claim 60, in which said energy bringing about said physical change in structure of said memory material is applied subsequent to the application of said imaging energy.

79. The method of claim 59, in which the catalyst material comprises ions, and in which an electric field is applied to said structures so as to accelerate the passage of the catalyst material through the transmissive portions of said barrier layer into contact with said memory material.

* * * * *